US009558752B2

(12) United States Patent
Daimou et al.

(10) Patent No.: US 9,558,752 B2
(45) Date of Patent: Jan. 31, 2017

(54) ENCODING DEVICE AND ENCODING METHOD

(71) Applicant: PANASONIC CORPORATION, Osaka (JP)

(72) Inventors: Katsunori Daimou, Hyogo (JP); Toshiyuki Morii, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 107 days.

(21) Appl. No.: 14/238,523

(22) PCT Filed: Sep. 21, 2012

(86) PCT No.: PCT/JP2012/006022
§ 371 (c)(1),
(2) Date: Feb. 12, 2014

(87) PCT Pub. No.: WO2013/051210
PCT Pub. Date: Apr. 11, 2013

(65) Prior Publication Data
US 2014/0214411 A1 Jul. 31, 2014

(30) Foreign Application Priority Data
Oct. 7, 2011 (JP) ................................ 2011-223021

(51) Int. Cl.
G10L 19/02 (2013.01)
G10L 19/24 (2013.01)
H03M 7/30 (2006.01)

(52) U.S. Cl.
CPC ........... *G10L 19/02* (2013.01); *G10L 19/0212* (2013.01); *G10L 19/24* (2013.01); *H03M 7/3073* (2013.01)

(58) Field of Classification Search
None
See application file for complete search history.

(56) References Cited

U.S. PATENT DOCUMENTS 6,895,095 B1* 5/2005 Thomas ........................ 381/94.7
2008/0027733 A1* 1/2008 Oshikiri ................ G10L 21/038
704/500

(Continued)

FOREIGN PATENT DOCUMENTS

JP 2009-042739 2/2009
JP 2009-094666 4/2009

(Continued)

OTHER PUBLICATIONS

Grill B, "A bit rate scalable perceptual coder for MPEG-4 Audio", AES, 60 East 42nd Street, Room 2520 New York 10165-2520, USA, XP040370949, Sep. 26, 1997, pp. 1-20.

(Continued)

*Primary Examiner* — Vincent Rudolph
*Assistant Examiner* — Richa Mishra
(74) *Attorney, Agent, or Firm* — Greenblum & Bernstein, P.L.C.

(57) ABSTRACT

This encoding device (100) is provided with: a CELP encoding unit (102) that decodes CELP encoded data resulting from CELP encoding an input signal, generating a CELP decoded signal; a transform encoding unit (106) that generates a decoded signal spectrum by decoding transform encoded data resulting from using the spectrum of the input signal and the suppression spectrum of suppressing using a first suppression factor to transform encode the amplitude of the spectrum of the CELP decoded signal, and that outputs an index of the transform encoded frequency component; a pulse index recording unit (107) that forms and records an array using the index; and a CELP component suppression unit (109) that uses a second suppression factor and the array (Continued)

to suppress the amplitude of the spectrum resulting from adding the decoded signal spectrum and the suppression spectrum.

2 Claims, 4 Drawing Sheets

(56) References Cited

U.S. PATENT DOCUMENTS

| | | | |
|---|---|---|---|
| 2009/0112607 A1 | 4/2009 | Ashley et al. | |
| 2009/0234644 A1* | 9/2009 | Reznik | G10L 19/24 704/203 |
| 2009/0281811 A1 | 11/2009 | Oshikiri et al. | |
| 2010/0017199 A1* | 1/2010 | Oshikiri | G10L 19/005 704/205 |
| 2010/0017200 A1 | 1/2010 | Oshikiri et al. | |
| 2010/0057446 A1* | 3/2010 | Morii | G10L 19/038 704/205 |
| 2010/0169101 A1* | 7/2010 | Ashley | G10L 19/24 704/500 |
| 2012/0136653 A1 | 5/2012 | Oshikiri et al. | |
| 2013/0085752 A1 | 4/2013 | Kawashima et al. | |
| 2013/0166308 A1 | 6/2013 | Kawashima et al. | |

FOREIGN PATENT DOCUMENTS

| | | |
|---|---|---|
| WO | 2007/043648 | 4/2007 |
| WO | 2011/155144 | 12/2011 |
| WO | 2012/032759 | 3/2012 |

OTHER PUBLICATIONS

Supplementary European Search Report from E.P.O., mail date is Mar. 6, 2015.

Telecommunication Standardization Sector of ITU, "Frame error robust narrow-band and wideband embedded variable bit-rate coding of speech and audio from 8-32 kbit/s", Reoommendation ITU-T G.718, Jun. 2008.

International Search Report in PCT/JP2012/006022, mailed on Jan. 8, 2013.

European Office Action for European Patent Application No. 12 837 789.2, mail date is Feb. 19, 2016.

* cited by examiner

ENCODING DEVICE AND ENCODING METHOD

TECHNICAL FIELD

The present invention relates to an encoding apparatus and an encoding method.

BACKGROUND ART

As a coding scheme which can compress speech, music, or the like at a low bit rate and with high sound quality, there has been proposed a coding scheme which combines a CELP (Code Excited Linear Prediction) coding scheme suitable for a speech signal with a transform coding scheme suitable for a music signal in a layered structure (see, for example, Non-Patent Literature (hereinafter, referred to as "NPL") 1). Hereinafter, a speech signal and a music signal may be collectively referred to as a sound signal.

In this coding scheme, an encoding apparatus first encodes an input signal using the CELP coding scheme to generate CELP encoded data. The encoding apparatus then performs transform coding on a residual spectrum obtained by converting a residual signal between the input signal and a CELP decoded signal (result of decoding the CELP encoded data) (hereinafter, referred to as a CELP residual signal) into a frequency domain, thereby providing high sound quality. As the transform coding scheme, there has been proposed a scheme which generates pulses at frequencies having high residual spectrum energy and encodes information of the pulses (see NPL 1).

However, although the CELP coding scheme is suitable for encoding a speech signal, the CELP coding scheme may degrade the sound quality of a music signal because the coding model is different for a music signal. Accordingly, when a music signal is encoded using the CELP coding scheme, there is a problem in that it is difficult to improve the sound quality even when the CELP residual signal (residual spectrum) is encoded using the transform coding scheme because of a larger component of the CELP residual signal.

To solve the above problem, there has been proposed a coding scheme which provides high sound quality by performing transform coding on a residual spectrum calculated using a result of suppressing an amplitude of a frequency component of a CELP decoded signal (hereinafter, referred to as a CELP component) (hereinafter, referred to as a CELP component suppressing method) (see, for example, Patent Literature (hereinafter referred to as "PTL") 1 and NPL 1 (section 6.11.6.2)).

In the CELP component suppressing method disclosed in NPL 1, when a sampling frequency of an input signal is 16 kHz, the amplitude of the CELP component is suppressed (hereinafter, referred to as CELP suppression) only in an intermediate band between 0.8 kHz and 5.5 kHz. In NPL 1, an encoding apparatus does not perform transform coding on the CELP residual signal alone, but applies another transform coding scheme in a lower layer prior to the transform coding, thereby reducing the CELP residual signal (see, for example, NPL 1 (section 6.11.6.1)). Therefore, the encoding apparatus does not perform CELP suppression on the frequency component encoded by another transform coding scheme even in the intermediate band and passes the transform encoded data in the lower layer to a higher layer and determines whether each frequency component has a value other than 0. For a frequency component having a value other than 0, the encoding apparatus determines that transform coding has been performed in the lower layer and does not perform CELP suppression. Meanwhile, for a frequency component having a value of 0, the encoding apparatus determines that transform coding has not been performed in the lower layer and performs CELP suppressing processing. CELP suppressing coefficients indicating the degrees (levels) of CELP suppression are uniform in frequencies in the intermediate band other than the frequencies for which CELP suppression is not performed.

The encoding apparatus performs CELP suppression by multiplying the CELP component (CELP decoded signal) by a CELP suppressing coefficient stored in a CELP suppressing coefficient code book prior to the transform coding and then obtains a residual spectrum between the input signal and the CELP decoded signal (CELP decoded signal that has been subjected to the CELP suppression) and performs transform coding on the residual spectrum.

Meanwhile, a decoding apparatus suppresses the CELP component of the CELP decoded signal using a CELP suppressing coefficient transmitted from the encoding apparatus and adds a transform coding decoded signal to the CELP decoded signal in which the CELP component has been suppressed. By this means, the decoding apparatus can obtain a decoded signal with less degradation in sound quality due to CELP coding when performing coding in which CELP coding and transform coding are combined in a layered structure.

CITATION LIST

Patent Literature

PTL 1
U.S. Patent Application Publication No. 2009-0112607

Non-Patent Literature

NPL 1
Recommendation ITU-T G. 718, June, 2008

SUMMARY OF INVENTION

Technical Problem

When the above-described CELP component suppressing method is performed in a plurality of layers in multiple stages, no CELP suppression is performed in higher layers for the frequency components on which transform coding has been performed even once in lower layers, so that it is necessary to pass the decoded signals of the transform encoded data in the layers in which transform coding has been performed to all the higher layers in which CELP suppression is to be performed. In this case, there is a problem in that a significant amount of memory is consumed because the amount of the transform encoded data in the lower layers to be passed to the higher layers increases with an increase in the number of layers in which the CELP suppression is performed.

Further, as a result of employing a scheme of passing the decoded signals in the lower layers to the higher layers, it is required in the layers in which the CELP suppression is to be performed to determine values for all the frequency components of the decoded signals passed from the lower layers to decide whether or not to perform CELP suppression. When the CELP suppression is performed in a plurality of layers in multiple stages using this scheme, there is a problem in that the amount of computation increases significantly because the number of the decoded signals whose values should be determined increases in the higher layers.

A first object of the present invention is to provide an encoding apparatus and an encoding method which can reduce a memory usage amount by preparing an array for storing frequency indices (hereinafter, referred to as coding pulse indices) at the time when transform coding has been performed on each frequency component in lower layers and passing this array to higher layers, when CELP suppression is performed in a plurality of layers in multiple stages.

A second object of the present invention is to provide an encoding apparatus and an encoding method which can reduce the amount of computation by passing the array from the lower layers to the higher layers and simply multiplying output signals from the lower layers by the array, thereby performing CELP suppression without performing the above-described determination of the values.

Solution to Problem

An encoding apparatus according to an aspect of the present invention includes: a first coding section that performs first coding on an input signal to obtain a first code, decodes the first code, and outputs a spectrum of a generated first decoded signal; a first suppressing section that suppresses an amplitude of the spectrum of the first decoded signal using a first suppression coefficient to generate a first suppressed spectrum; a residual spectrum calculating section that calculates a residual spectrum using a spectrum of the input signal and the first suppressed spectrum; a second coding section that performs second coding using the residual spectrum to obtain a second code, decodes the second code, and outputs a spectrum of a generated second decoded signal; a pulse position storing section that outputs a pulse position storing array which stores a frequency index among the second code encoded in the second coding section; and a second suppressing section that suppresses an amplitude of an added spectrum obtained by adding the spectrum of the second decoded signal and the first suppressed spectrum, using a second suppression coefficient and the pulse position storing array to generate a second suppressed spectrum.

An encoding method according to an aspect of the present invention includes: performing first coding on an input signal to obtain a first code, decoding the first code, and outputting a spectrum of a generated first decoded signal; suppressing an amplitude of the spectrum of the first decoded signal using a first suppression coefficient to generate a first suppressed spectrum; calculating a residual spectrum using a spectrum of the input signal and the first suppressed spectrum; performing second coding to obtain a second code using the residual spectrum calculated by inputting, in the calculating of the residual spectrum, the first suppressed spectrum generated using the suppression coefficient in the suppressing of the amplitude of the spectrum of the first decoded signal, decoding the second code, and outputting a spectrum of a generated second decoded signal; outputting a pulse position storing array which stores a frequency index encoded in the second coding; and suppressing an amplitude of an added spectrum obtained by adding the spectrum of the second decoded signal and the first suppressed spectrum, using a second suppression coefficient and the pulse position storing array to generate a second suppressed spectrum.

Advantageous Effects of Invention

According to the present invention, it is possible to reduce the amount of memory to be used for referring to the coding pulse indices indicating the frequency components for which transform coding was performed in the past and the amount of computation required for CELP component suppressing processing.

DESCRIPTION OF EMBODIMENTS

An embodiment of the present invention will be described in detail below with reference to the accompanying drawings. It should be noted that a sound encoding apparatus will be explained as an example of an encoding apparatus according to the present invention. As described above, a speech signal and a music signal are collectively referred to as a sound signal. That is, a sound signal refers to any signal among substantially a speech signal alone, substantially a music signal alone, and a signal in which a speech signal and a music signal are mixed.

Further, the encoding apparatus according to the present invention has at least three layers for performing coding. In the following description, the encoding apparatus uses CELP coding as coding suitable for a speech signal and uses transform coding as coding suitable for a music signal, respectively as representative coding. The encoding apparatus uses a coding scheme in which the CELP coding and the transform coding are combined in a layered structure and the transform coding is further combined in the layered structure.

In the following description, the layer in which CELP coding is performed as first coding is referred to as a first layer, the layer in which first transform coding is performed as second coding is referred to as a second layer, and the layer in which second transform coding is performed as third coding is referred to as a third layer.

Embodiment

Figure 1:
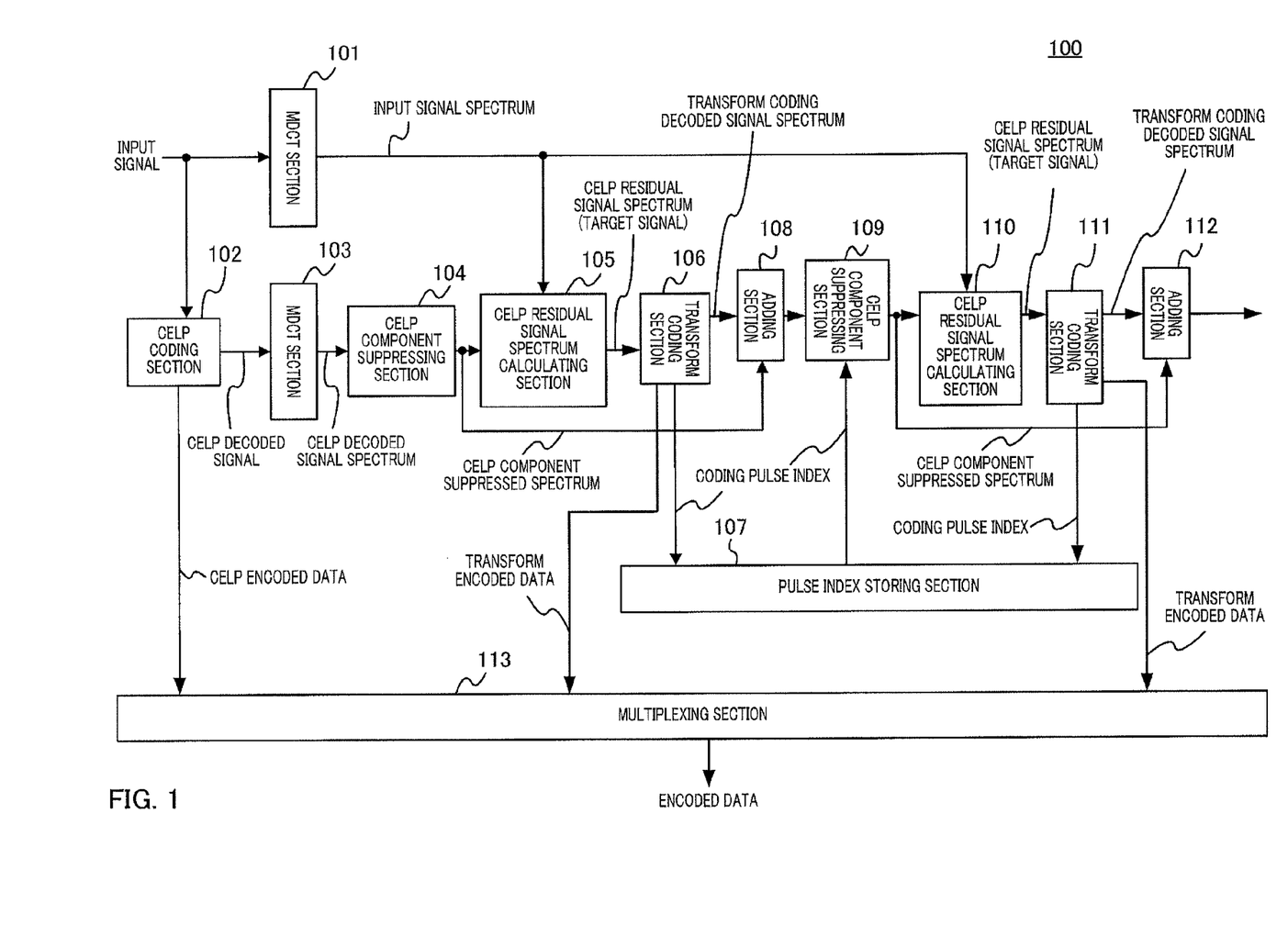
FIG. 1 is a block diagram illustrating a configuration of an encoding apparatus according to an embodiment of the present invention.

FIG. 1 is a block diagram illustrating a main configuration of encoding apparatus 100 according to Embodiment 1 of the present invention. Encoding apparatus 100 encodes an input signal such as speech and music using a coding scheme in which CELP coding and transform coding are combined in a layered structure and outputs encoded data. As shown in FIG. 1, encoding apparatus 100 includes MDCT (Modified Discrete Cosine Transform) section 101, CELP coding section 102, MDCT section 103, CELP component suppressing section 104, CELP residual signal spectrum calculating section 105, transform coding section 106, pulse index storing section 107 and adding section 108. The sections from CELP component suppressing section 109 to adding section 112 are provided by hierarchically combining the sections from CELP component suppressing section 104 to adding section 108. That is, a three-layered structure is assumed in this configuration and a CELP component is suppressed in each layer in which transform coding is performed. Hereinafter, CELP coding section 102 and MDCT section 103 are regarded as the first layer, CELP component suppressing section 104, CELP residual signal spectrum calculating section 105, transform coding section 106, pulse index storing section 107 and adding section 108 are regarded as the second layer, and CELP component suppressing section 109, CELP residual signal spectrum calculating section 110, transform coding section 111, pulse index storing section 107 and adding section 112 are regarded as the third layer (where pulse index storing section 107 is shared by the second layer and the third layer).

In encoding apparatus 100 shown in FIG. 1, MDCT section 101 performs MDCT processing on the input signal to generate an input signal spectrum. MDCT section 101 outputs the generated input signal spectrum to CELP residual signal spectrum calculating sections 105 and 110.

Each component of the first layer will be described below.

CELP coding section 102 encodes the input signal using a CELP coding scheme to generate CELP encoded data (a first code). Further, CELP coding section 102 decodes (locally decodes) the generated CELP encoded data to generate a CELP decoded signal (a first decoded signal). CELP coding section 102 outputs the CELP encoded data to multiplexing section 113 and outputs the CELP decoded signal to MDCT section 103.

MDCT section 103 performs MDCT processing on the CELP decoded signal input from CELP coding section 102 to generate a CELP decoded signal spectrum. MDCT section 103 outputs the generated CELP decoded signal spectrum to CELP component suppressing section 104.

As described above, CELP coding section 102 and MDCT section 103 generate the first code by performing first coding on the input signal and outputs a spectrum of the first decoded signal generated by decoding the obtained first code. Accordingly, CELP coding section 102 and MDCT section 103 operate as, for example, a first coding section and constitute the first layer.

Each component of the second layer will be described below.

CELP component suppressing section 104 selects an optimum suppressing coefficient which minimizes coding distortion from among suppressing coefficient candidates stored in CELP component suppressing section 104 in advance and multiplies each frequency component of the CELP decoded signal spectrum input from MDCT section 103 by the optimum suppressing coefficient to calculate a CELP component suppressed spectrum. CELP component suppressing section 104 outputs the CELP component suppressed spectrum to CELP residual signal spectrum calculating section 105 and adding section 108.

CELP residual signal spectrum calculating section 105 calculates a CELP residual signal spectrum which is a difference between an input signal spectrum input from MDCT section 101 and the CELP component suppressed spectrum input from CELP component suppressing section 104. Specifically, CELP residual signal spectrum calculating section 105 obtains the CELP residual signal spectrum by subtracting the CELP component suppressed spectrum from the input signal spectrum. CELP residual signal spectrum calculating section 105 outputs the CELP residual signal spectrum to transform coding section 106 as a target signal for transform coding.

Transform coding section 106 encodes the CELP residual signal spectrum input from CELP residual signal spectrum calculating section 105 using transform coding to generate transform encoded data (a second code). The transform encoded data includes index data (coding pulse index) of a frequency component for which at least transform coding has been performed. Further, transform coding section 106 decodes (locally decodes) the generated transform encoded data to generate a transform coding decoded signal spectrum (a second decoded signal). At this time, transform coding section 106 performs coding so as to reduce distortion between the CELP residual signal spectrum and the transform coding decoded signal spectrum. Transform coding section 106 performs coding so as to reduce the distortion by generating pulses at frequencies having large amplitudes (energy) in the CELP residual signal spectrum. Transform coding section 106 outputs the transform coding decoded signal spectrum to adding section 108, outputs the coding pulse indices to pulse index storing section 107 and outputs the transform encoded data to multiplexing section 113.

Pulse index storing section 107 stores the coding pulse indices input from transform coding section 106 in the form of, for example, an array and outputs the coding pulse indices to CELP component suppressing section 109 in the third layer. How the stored array is used will be described in detail later.

Adding section 108 adds the CELP component suppressed spectrum input from CELP component suppressing section 104 and the transform coding decoded signal spectrum input from transform coding section 106 to calculate a decoded signal spectrum and outputs the decoded signal spectrum to CELP component suppressing section 109 in the third layer.

The components from CELP component suppressing section 104 to adding section 108 operate as described above. Accordingly, the components from CELP component suppressing section 104 to adding section 108 operate as, for example, a second coding section and constitute the second layer.

The third layer will be described below.

CELP component suppressing section 109 selects an optimum suppressing coefficient which minimizes coding distortion from among suppressing coefficient candidates stored in CELP component suppressing section 109 in advance. Further, CELP component suppressing section 109 judges a frequency index of a CELP component to be suppressed using the array output from pulse index storing section 107. CELP component suppressing section 109 performs CELP suppression by multiplying only a frequency component corresponding to the judged frequency index in the decoded signal spectrums input from adding section 108 in the second layer by the optimum suppressing coefficient to calculate a CELP component suppressed spectrum. CELP component suppressing section 109 outputs the CELP component suppressed spectrum to CELP residual signal spectrum calculating section 110 and adding section 112. CELP component suppressing processing will be described in detail later.

CELP residual signal spectrum calculating section 110 calculates a CELP residual signal spectrum which is a difference between the input signal spectrum input from MDCT section 101 and the CELP component suppressed spectrum input from CELP component suppressing section 109. Specifically, CELP residual signal spectrum calculating section 110 obtains the CELP residual signal spectrum by subtracting the CELP component suppressed spectrum from the input signal spectrum. CELP residual signal spectrum calculating section 110 outputs the CELP residual signal spectrum to transform coding section 111 as a target signal.

Transform coding section 111 encodes the CELP residual signal spectrum input from CELP residual signal spectrum calculating section 110 to generate transform encoded data. The transform encoded data includes index data (coding pulse index) of a frequency component for which at least transform coding has been performed. Further, transform coding section 111 decodes (locally decodes) the generated transform encoded data to generate a transform coding decoded signal spectrum. At this time, transform coding section 111 performs coding so as to reduce distortion between the CELP residual signal spectrum and the transform coding decoded signal spectrum. Transform coding section 111 performs coding so as to reduce the distortion by generating pulses at frequencies having large amplitudes (energy) in the CELP residual signal spectrum. Transform coding section 111 then outputs the transform coding decoded signal spectrum to adding section 112, outputs the coding pulse indices to pulse index storing section 107 and outputs the transform encoded data to multiplexing section 113.

Pulse index storing section 107 stores the coding pulse indices input from transform coding section 111 in the form of, for example, an array. How the stored array is used will be described in detail later.

Adding section 112 adds the CELP component suppressed spectrum input from CELP component suppressing section 109 and the transform coding decoded signal spectrum input from transform coding section 111 to calculate a decoded signal spectrum and outputs the decoded signal spectrum to a further higher layer.

The components from CELP component suppressing section 109 to adding section 112 operate as described above. Accordingly, the components from CELP component suppressing section 109 to adding section 112 operate as, for example, a third coding section and constitute the third layer.

Multiplexing section 113 multiplexes the CELP encoded data input from CELP coding section 102, and the transform encoded data input from transform coding sections 106 and 111 and transmits the multiplexing result to a decoding apparatus as encoded data.

The pulse index storing processing at encoding apparatus 100 (FIG. 1) will be described in detail below.

First, an example of a method for storing pulse indices at pulse index storing section 107 will be described below.

In the CELP component suppressing processing, CELP suppression is not performed for a frequency component for which transform coding has been performed in lower layers. This is because transform coding has been already performed to reduce an error. To achieve this, there has been proposed a scheme which performs judgment for all the frequency components as to whether or not transform coding was performed on the frequency component in the past by referring to the decoded signals from the lower layers before performing the CELP suppression (see, for example, NPL 1). However, when CELP suppression is performed in higher layers in multiple stages, the number of decoded signals to be passed from the lower layers to the higher layers increases. Further, it is necessary to perform determination on the decoded signals from the lower layers as to whether or not transform coding has been performed for each frequency component, which, however, increases the amount of computation. To address this, a mechanism is prepared for storing indices (coding pulse indices) of the frequency components for which transform coding was performed in the past.

Figure 2:
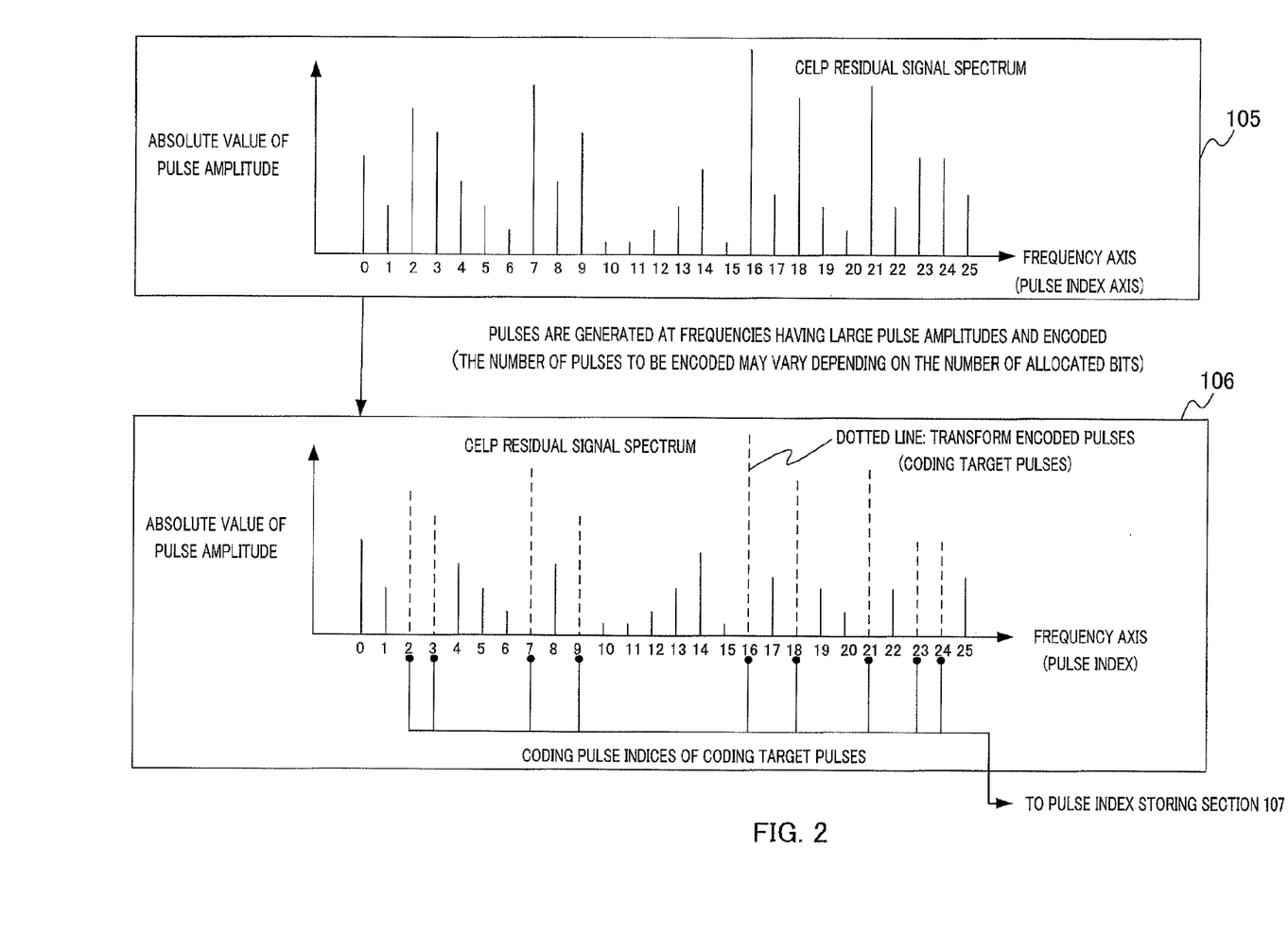
FIG. 2 is a diagram for explaining a procedure of extracting coding pulse indices according to the embodiment of the present invention.

FIG. 2 illustrates a procedure in which transform coding section 106 encodes the CELP residual signal spectrum output from CELP residual signal spectrum calculating section 105 and outputs the coding pulse indices to pulse index storing section 107.

FIG. 2 illustrates, for example, a case where the CELP residual signal spectrum is configured with 26 pulses. Among these 26 pulses, transform coding section 106 encodes pulses at frequencies having large amplitudes (energy). It should be noted that the number of pulses to be encoded is not always fixed, and increases or decreases according to the number of bits to be allocated to transform coding section 106 or variation of amplitudes of pulses of the CELP residual signal spectrum. Here, frequency indices of the encoded pulses (pulse indices) are output to pulse index storing section 107.

The pulse indices input to pulse index storing section 107 are stored in the form of, for example, an array. This array is stored in pulse index storing section 107, that is, a memory. A specific storing method will be described below.

Figure 3:
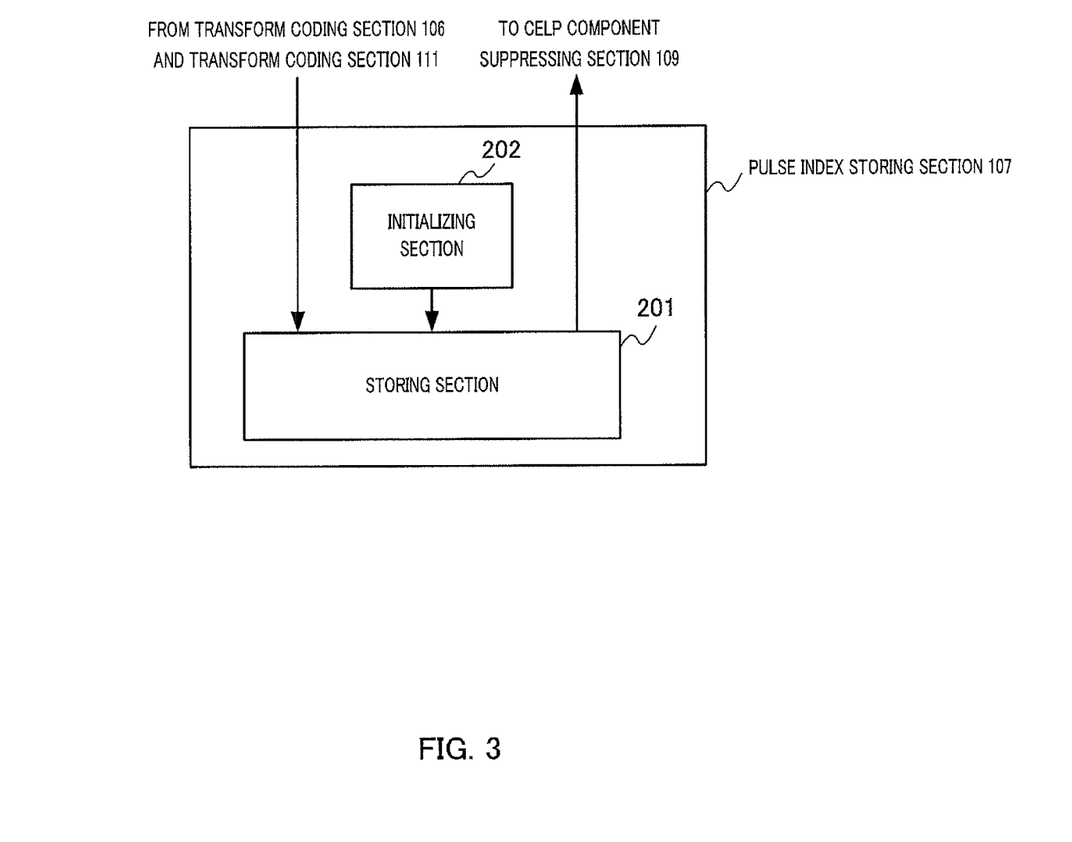
FIG. 3 is a block diagram illustrating a configuration of a pulse index storing section according to the embodiment of the present invention.

FIG. 3 is a block diagram illustrating a configuration of pulse index storing section 107. Pulse index storing section 107 is configured with storing section 201 and initializing section 202. Storing section 201 stores array P in which the frequency indices of pulses (pulse indices) are stored. Array P is appropriately updated as necessary. Initializing section 202 initializes array P stored in storing section 201 to an array initial value at a predetermined timing.

Figure 4:
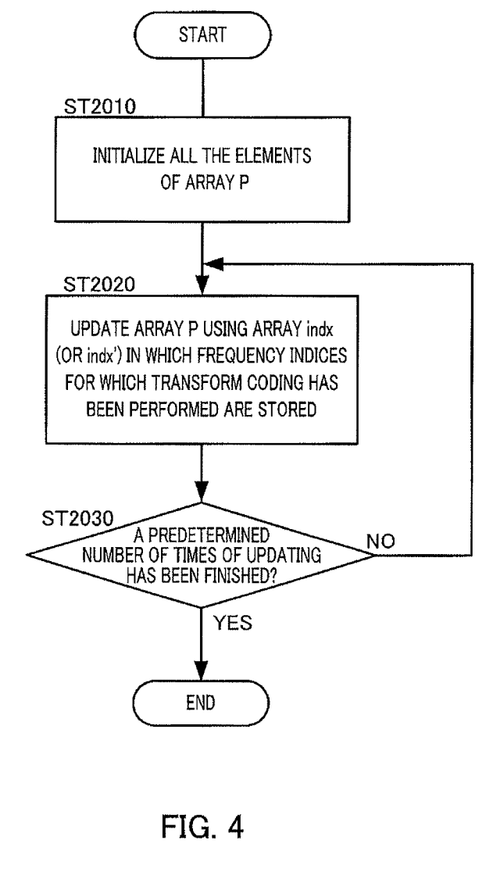
FIG. 4 is a flowchart for explaining steps of coding pulse index storing processing according to the embodiment of the present invention.

FIG. 4 is a flowchart illustrating steps of storing processing of pulse index storing section 107.

Initializing section 202 initializes array P stored in storing section 201 before transform coding is performed in processing target frames (or subframes) so that all the elements become array initial values as expressed in the following equation 1 (ST 2010). Here, the array initial value is set to 1. By this means, an equation of CELP suppression becomes simple and the amount of computation is reduced.

[1]

$$P[k]=1(k=0,\ldots,L-1) \qquad \text{(Equation 1)}$$

In this equation, k indicates an index of a frequency component, and L indicates a length of a transform coding decoded signal spectrum. This initializing processing is executed for each coding processing unit (typically, a frame or subframe) only once before coding processing is performed.

Storing section 201 replaces (updates) a value of an element P[indx[j]] in initialized array P with 0 as expressed in the following equation 2 using an array indx[j] in which indices of frequency components (coding pulse indices) for which transform coding has been performed in transform coding section 106 are stored in elements in ascending order (ST 2020). This processing is referred to as pulse index storing processing. Here, j indicates an index of the array indx. Further, N indicates a length of the array indx, that is, a maximum value of the number of pulses which can be generated in the layer.

[2]

$$P[k]=0 (\text{if } k=\text{indx}[j], j=0,\ldots,N-1) \qquad \text{(Equation 2)}$$

Storing section 201 passes array P for which the pulse index storing processing has been performed using equation 2 to CELP component suppressing section 109. CELP component suppressing section 109 performs CELP suppression as expressed in the following equation 3 by referring to array P.

[3]

$$Sn'[k]=Sn[k]\cdot(1-g\cdot P[k])(k=0,\ldots,L-1) \quad \text{(Equation 3)}$$

Here, Sn indicates an output signal spectrum output from the n-th layer, and Sn' indicates a CELP component suppressed spectrum after CELP suppression has been performed on Sn. g indicates a suppressing coefficient of a CELP component, and can be a value between 0 and 1.

As described above, CELP component suppressing section 109 does not have to determine a value for each frequency component to perform CELP suppression, but can perform CELP suppression only by performing simple operation processing as expressed in equation (3) on the array P passed from the lower layers.

When transform coding is performed in the higher layers (here, by transform coding section 111), the array P is updated as expressed in the following equation (4) using a coding pulse index indx' of the higher layers passed to storing section 201 of pulse index storing section 107 (ST 2020).

The array P is updated a predetermined number of times (basically, corresponding to the number of layers in which transform coding is performed) (ST 2030).

[4]

$$P[k]=0(\text{if } k=\text{indx}'[j],j=0,\ldots,N-1) \quad \text{(Equation 4)}$$

In this way, array P is updated in a case where transform coding associated with the CELP suppression processing is performed in the further higher layers. That is, when CELP suppression is performed in multiple stages in a plurality of layers in which transform coding is performed, it is only necessary to use only array P updated in the lower layers, and it is not necessary to pass the output signals of all the lower layers in which transform coding has been performed to the higher layers for reference.

The embodiment of the present invention has been described thus far.

While in the above-described embodiment, an example of suppressing a CELP component has been described using a layered structure in which suppression processing is performed in two stages, the present invention can be implemented in structures where CELP suppression is performed in more stages and can provide the same advantageous effects.

Further, while in the above-described embodiment, CELP coding has been described as an example of coding suitable for a speech signal, the present invention can be implemented using ADPCM (Adaptive Differential Pulse Code Modulation), APC (Adaptive Prediction Coding), ATC (Adaptive Transform Coding), TCX (Transform Coded Excitation), or the like and can provide the same advantageous effects.

Further, while in the above-described embodiment, transform coding has been described as an example of coding suitable for a music signal, any coding scheme may be employed which can efficiently encode a residual signal between a decoded signal and an input signal of a coding scheme suitable for a speech signal in a frequency domain. Such coding scheme includes FPC (Factorial Pulse Coding), AVQ (Algebraic Vector Quantization), or the like, which can provide the same advantageous effects.

Further, while in the above-described embodiment, an array has been introduced and described as an example of a pulse index storing method, the present invention can be also implemented using a pointer, or the like, which can hold logical positional information relating to coding pulse index information stored in a memory and which can be used for continuous reference by increment operation.

In the embodiment described above, the present invention is configured with hardware by way of example, but the invention may also be provided by software in concert with hardware.

In addition, the functional blocks used in the descriptions of the embodiments are typically implemented as LSI devices, which are integrated circuits. The functional blocks may be formed as individual chips, or a part or all of the functional blocks may be integrated into a single chip. The term "LSI" is used herein, but the terms "IC," "system LSI," "super LSI" or "ultra LSI" may be used as well depending on the level of integration.

In addition, the circuit integration is not limited to LSI and may be achieved by dedicated circuitry or a general-purpose processor other than an LSI. After fabrication of LSI, a field programmable gate array (FPGA), which is programmable, or a reconfigurable processor which allows reconfiguration of connections and settings of circuit cells in LSI may be used.

Should a circuit integration technology replacing LSI appear as a result of advancements in semiconductor technology or other technologies derived from the technology, the functional blocks could be integrated using such a technology. Another possibility is the application of biotechnology and/or the like.

The disclosure of the specification, drawings, and abstract included in Japanese Patent Application No. 2011-223021, filed on Oct. 7, 2011 is incorporated herein by reference in its entirety.

INDUSTRIAL APPLICABILITY

The present invention can reduce the amount of memory and the amount of computation in the whole apparatus while suppressing degradation in coding quality and is suitable for use in, for example, a packet communication system, a mobile communication system, and the like.

REFERENCE SIGNS LIST

100 Encoding apparatus
101, 103 MDCT section
102 CELP coding section
104, 109 CELP component suppressing section
105, 110 CELP residual signal spectrum calculating section
106, 111 Transform coding section
107 Pulse index storing section
108, 112 Adding section
113 Multiplexing section
201 Storing section
202 Initializing section

The invention claimed is:
1. An encoding apparatus, comprising:
a memory that stores instructions; and
a processor that executes the instructions;
wherein, when executed by the processor, the instructions cause the encoding apparatus to perform a process comprising:
receiving an input audio signal comprising one of a speech signal, a music signal, and a signal that is a mixture of the speech signal and the music signal;
performing first coding on the input audio signal to obtain a first code, and decoding the first code to generate a spectrum of a first decoded signal;

suppressing an amplitude of the spectrum of the first decoded signal using a first suppression coefficient to generate a first suppressed spectrum;
calculating a residual spectrum using a spectrum of the input audio signal and the first suppressed spectrum;
performing second coding of a frequency index of a pulse position and an amplitude of a pulse generated at the residual spectrum to obtain a second code, and decoding the second code to generate a spectrum of a second decoded signal;
initializing all elements of a pulse position storing array to a value of 1;
setting a value of 0 in elements of the pulse position storing array corresponding to the frequency index of the pulse position encoded using the second coding, the pulse position storing array indicating whether the frequency index has been encoded using the second coding;
generating an added spectrum by adding the spectrum of the second decoded signal to the first suppressed spectrum;
suppressing an amplitude of a frequency component of the added spectrum corresponding to the frequency index which has not been encoded using the second coding, using a second suppression coefficient and the pulse position storing array to generate a second suppressed spectrum used for generating encoding data which is transmitted to a decoding apparatus; and
outputting the encoded data, wherein
when k-th frequency index of the pulse position has been encoded using the second coding, k-th element P[k] of the pulse position storing array is equal to the value of 0,
when k-th frequency index of the pulse position has not been encoded using the second coding, P[k] is equal to the value of 1, and
an amplitude of k-th frequency component of the added spectrum is suppressed according to a following equation to generate k-th frequency component of the second suppressed spectrum:

$Sn'[k]=Sn[k]\cdot(1-g\cdot P[k])$ wherein Sn[k] indicates the amplitude of the k-th frequency component of the added spectrum, Sn'[k] indicates the amplitude of the k-th frequency component of the second suppressed spectrum, and g indicates the second suppression coefficient.

2. An encoding method, comprising:
receiving an input audio signal comprising one of a speech signal, a music signal, and a signal that is a mixture of the speech signal and the music signal;
performing first coding on the input audio signal to obtain a first code, and decoding the first code to generate a spectrum of a first decoded signal;
suppressing an amplitude of the spectrum of the first decoded signal using a first suppression coefficient to generate a first suppressed spectrum;
calculating a residual spectrum using a spectrum of the input audio signal and the first suppressed spectrum;
performing second coding of a frequency index of a pulse position and an amplitude of a pulse generated at the residual spectrum to obtain a second code and decoding the second code to generate a spectrum of a second decoded signal;
initializing all elements of a pulse position storing array to a value of 1;
setting a value of 0 in elements of the pulse position storing array corresponding to the frequency index of the pulse position encoded using the second coding, the pulse position storing array indicating whether the frequency index has been encoded using the second coding;
generating an added spectrum by adding the spectrum of the second decoded signal to the first suppressed spectrum;
suppressing an amplitude of a frequency component of the added spectrum corresponding to the frequency index which has not been encoded using the second coding, using a second suppression coefficient and the pulse position storing array to generate a second suppressed spectrum used for generating encoding data which is transmitted to a decoding side; and
outputting the encoded data, wherein
when k-th frequency index of the pulse position has been encoded using the second coding, k-th element P[k] of the pulse position storing array is equal to the value of 0,
when k-th frequency index of the pulse position has not been encoded using the second coding, P[k] is equal to the value of 1, and
an amplitude of k-th frequency component of the added spectrum is suppressed according to a following equation to generate k-th frequency component of the second suppressed spectrum:

$Sn'[k]=Sn[k]\cdot(1-g\cdot P[k])$ wherein Sn[k] indicates the amplitude of the k-th frequency component of the added spectrum, Sn'[k] indicates the amplitude of the k-th frequency component of the second suppressed spectrum and g indicates the second suppression coefficient.

* * * * *